US012695382B2

(12) United States Patent (10) Patent No.: US 12,695,382 B2
Yamada (45) Date of Patent: Jul. 28, 2026

(54) CURRENT DETECTION CIRCUIT, INTEGRATED CIRCUIT, AND POWER SUPPLY CIRCUIT

(71) Applicant: FUJI ELECTRIC CO., LTD., Kawasaki (JP)

(72) Inventor: Ryuji Yamada, Hachioji-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 266 days.

(21) Appl. No.: 18/521,225

(22) Filed: Nov. 28, 2023

(65) Prior Publication Data

US 2024/0243658 A1     Jul. 18, 2024

(30) Foreign Application Priority Data

Jan. 13, 2023    (JP) ................................. 2023-003542

(51) Int. Cl.
 H02M 3/155 (2006.01)
 G01R 19/175 (2006.01)
 H02M 1/08 (2006.01)
 H03K 5/24 (2006.01)
(52) U.S. Cl.
 CPC .......... H02M 3/155 (2013.01); G01R 19/175 (2013.01); H02M 1/08 (2013.01); H03K 5/24 (2013.01)

(58) Field of Classification Search
 CPC ...... H02M 3/155; H02M 1/08; H02M 1/0009; H02M 3/156; H02M 3/158; G01R 19/175; G01R 19/0092; H03K 5/24
 See application file for complete search history.

(56) References Cited

U.S. PATENT DOCUMENTS

| | | | |
|---|---|---|---|
| 7,800,354 B2 | 9/2010 | Kanouda et al. | |
| 8,129,958 B2 * | 3/2012 | Ku ...................... | H02M 1/4225 |
| | | | 323/222 |
| 2011/0181258 A1 * | 7/2011 | Ivanov ..................... | G05F 1/56 |
| | | | 323/234 |

FOREIGN PATENT DOCUMENTS

| | | |
|---|---|---|
| JP | 4374033 B2 | 12/2009 |
| JP | 2021-044969 A | 3/2021 |

* cited by examiner

*Primary Examiner* — Kyle J Moody
(74) *Attorney, Agent, or Firm* — Rabin & Berdo, P.C.

(57) ABSTRACT

A current detection circuit for a power supply circuit configured to generate an output voltage from an input voltage thereof, the power supply circuit including an inductor configured to receive the input voltage, a transistor configured to control an inductor current flowing through the inductor, and a diode coupled to a first node that is a node at which the inductor and the transistor are coupled. The current detection circuit is configured to detect the inductor current, and includes: a first capacitor coupled to the first node; and a second capacitor provided between the first capacitor and a ground, the second capacitor being coupled in series with the first capacitor.

11 Claims, 16 Drawing Sheets

CURRENT DETECTION CIRCUIT, INTEGRATED CIRCUIT, AND POWER SUPPLY CIRCUIT

CROSS-REFERENCE TO RELATED APPLICATION

The present application claims priority pursuant to 35 U.S.C. § 119 from Japanese patent application number 2023-003542 filed on Jan. 13, 2023, the entire disclosure of which is hereby incorporated by reference herein.

BACKGROUND

Technical Field

The present disclosure relates to a current detection circuit, an integrated circuit, and a power supply circuit.

Description of the Related Art

In general, with respect to power factor correction circuits that operate in a critical mode, there are detection circuits configured to detect that an inductor current reaches zero after a transistor is turned off (for example, Japanese Patent Application Publication No. 2021-044969 and Japanese Patent No. 4374033).

Some of the detection circuits configured to detect that the inductor current reaches zero use a transformer that includes a secondary winding having predetermined turns ratio with respect to an inductor. However, such a transformer generally cannot be realized with general-purpose components, which results in being expensive.

SUMMARY

A first aspect of the present disclosure is a current detection circuit for a power supply circuit configured to generate an output voltage from an input voltage thereof, the power supply circuit including an inductor configured to receive the input voltage, a transistor configured to control an inductor current flowing through the inductor, and a diode coupled to a first node, which is a node at which the inductor and the transistor are coupled, the current detection circuit being configured to detect the inductor current, the current detection circuit comprising: a first capacitor coupled to the first node; and a second capacitor provided between the first capacitor and a ground, the second capacitor being coupled in series with the first capacitor.

A second aspect of the present disclosure is an integrated circuit for a power supply circuit configured to generate an output voltage from an input voltage thereof, the power supply circuit including an inductor configured to receive the input voltage, a transistor configured to control an inductor current flowing through the inductor, a diode coupled to a first node at which the inductor and the transistor are coupled, and a current detection circuit configured to detect the inductor current, the integrated circuit being configured to switch the transistor, wherein the current detection circuit includes a first capacitor coupled to the first node, and a second capacitor provided between the first capacitor and a ground, the second capacitor being coupled in series with the first capacitor, and the integrated circuit includes a terminal configured to receive a voltage at a second node at which the first capacitor and the second capacitor are coupled, a comparator circuit configured to compare the voltage at the terminal with a reference voltage, and a driver circuit configured to turn on the transistor, based on a result of comparison of the comparator circuit, and turn off the transistor, based on a voltage corresponding to the output voltage.

A third aspect of the present disclosure is a power supply circuit configured to generate an output voltage from an input voltage thereof, the power supply circuit comprising: an inductor configured to receive the input voltage; a transistor configured to control an inductor current flowing through the inductor; a diode coupled to a first node at which the inductor and the transistor are coupled, a current detection circuit configured to detect the inductor current; and an integrated circuit configured to switch the transistor, based on a detection voltage outputted from the current detection circuit, wherein the current detection circuit includes a first capacitor coupled to the first node, and a second capacitor provided between the first capacitor and a ground, the second capacitor being coupled in series with the first capacitor, the current detection circuit being configured to output, as the detection voltage, a voltage at a second node at which the first capacitor and the second capacitor are coupled, and the integrated circuit includes a terminal configured to receive the voltage at the second node at which the first capacitor and the second capacitor are coupled, a comparator circuit configured to compare the voltage at the terminal with a reference voltage, and a driver circuit configured to turn on the transistor, based on a result of comparison of the comparator circuit, and turn off the transistor, based on a voltage corresponding to the output voltage.

BRIEF DESCRIPTION OF THE DRAWINGS

FIG. 2A is a diagram illustrating an example of a current detection circuit 40a.

DETAILED DESCRIPTION

Figure 1:
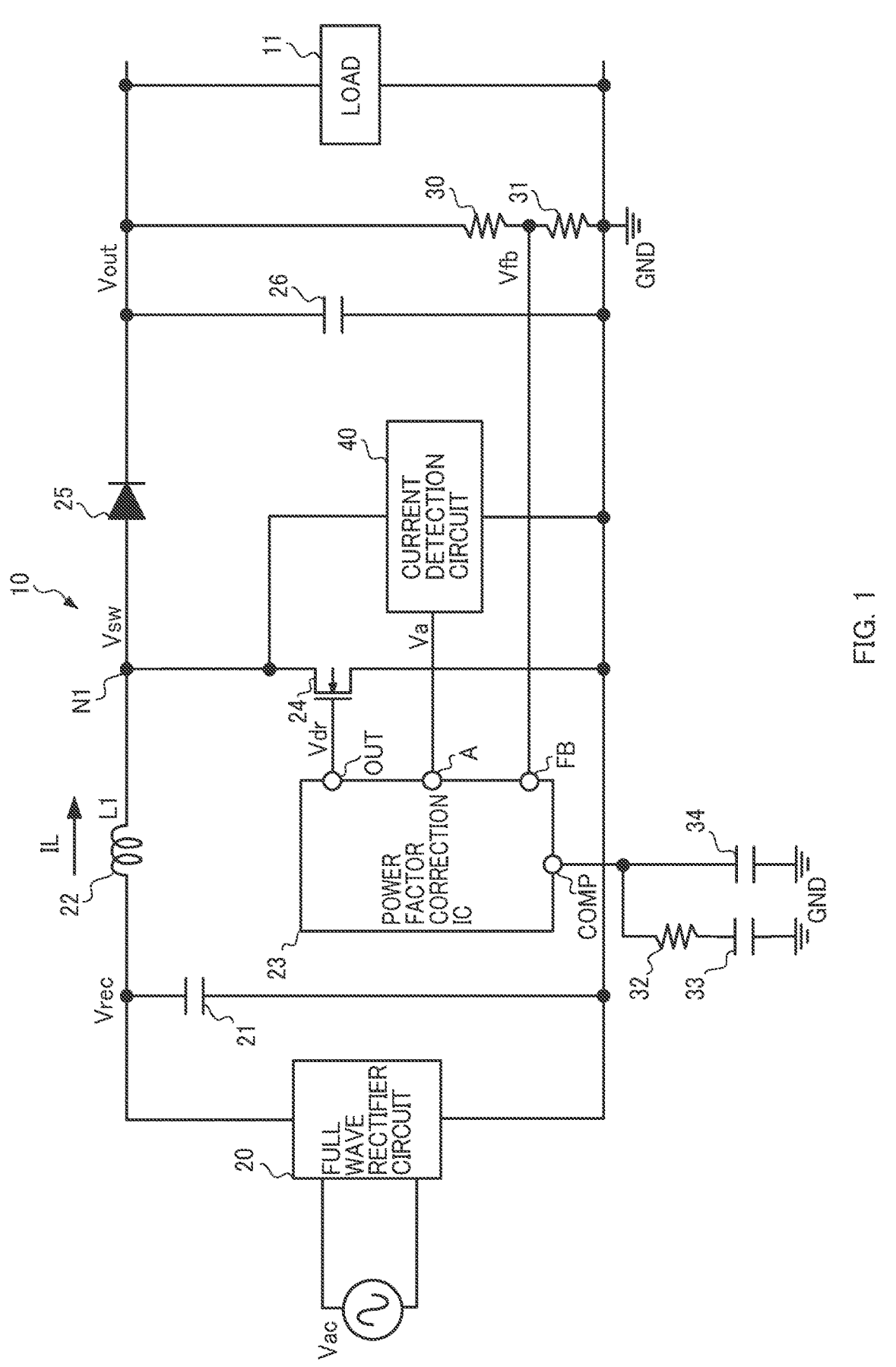
FIG. 1 is a diagram illustrating an example of an AC-DC converter 10.

At least following matters will become apparent from the descriptions of the present specification and the accompanying drawings.

Embodiments of the present invention will be described below with reference to the drawings. The same or equivalent constituent elements, members, and the like illustrated in the drawings are given the same reference numerals, and repetitive description is omitted as appropriate.

Embodiments

FIG. 1 is a diagram illustrating an example of a configuration of an AC-DC converter 10 which is an embodiment of the present disclosure. The AC-DC converter 10 is a boost chopper power supply circuit to generate an output voltage Vout of a target level from an alternating-current (AC) voltage Vac of a commercial power supply inputted thereto.

A load 11 is, for example, a DC-DC converter or an electronic device to operate on a direct-current (DC) voltage.

<<<Overview of AC-DC Converter 10>>>

The AC-DC converter 10 includes a full-wave rectifier circuit 20, capacitors 21, 26, 33, and 34, an inductor 22, a power factor correction IC 23, an N-channel metal-oxide-semiconductor (NMOS) transistor 24, a diode 25, resistors 30 to 32, and a current detection circuit 40.

The full-wave rectifier circuit 20 full-wave rectifies a predetermined AC voltage Vac inputted thereto, and applies a resultant voltage to the capacitor 21 and the inductor 22 as an input voltage Vrec. The AC voltage Vac herein is a voltage of 100 to 240 V with a frequency of 50 to 60 Hz, for example. Note that the rectified voltage Vrec corresponds to an "input voltage".

The rectified voltage Vrec is directly applied to the inductor 22; however, for example, the rectified voltage Vrec may be applied thereto through an element such as a resistor (not illustrated). Further, in an embodiment of the present disclosure, the term "apply" includes not only to directly supply a voltage to a predetermined node but also to indirectly supply a voltage through an element such as a resistor (not illustrated) and/or the like and to supply a divided voltage.

The capacitor 21 is an element to smooth the rectified voltage Vrec, and the rectified voltage Vrec is applied across the inductor 22 upon turning on of the NMOS transistor 24. Meanwhile, the inductor 22 supplies a current to the capacitor 26 through the diode 25 upon turning off of the NMOS transistor 24. Further, the inductance value of the inductor 22 is an inductance value L1.

The inductor 22 configures a boost chopper circuit, with the NMOS transistor 24, the diode 25, and the capacitor 26. Thus, the charge voltage of the capacitor 26 is the direct-current (DC) output voltage Vout. Note that the output voltage Vout is 390 V, for example.

The power factor correction IC 23 is an integrated circuit to control switching of the NMOS transistor 24 such that the level of the output voltage Vout reaches a target level (e. g. , 390 V) while correcting the power factor of the AC-DC converter 10. Specifically, the power factor correction IC 23 drives the NMOS transistor 24, based on the inductor current IL flowing through the inductor 22 and the output voltage Vout.

The power factor correction IC 23 has terminals FB, A, COMP, and OUT, which will be described later in detail. The power factor correction IC 23 includes terminals other than the above-described four terminals FB, A, COMP, and OUT, however, other terminals are omitted herein for convenience.

The NMOS transistor 24 is a transistor to control power to the load 11 of the AC-DC converter 10. In an embodiment of the present disclosure, the NMOS transistor 24 is a Metal Oxide Semiconductor (MOS) transistor, but it is not limited thereto. As long as it is a transistor capable of controlling power, the NMOS transistor 24 may be a bipolar transistor, for example. The gate electrode of the NMOS transistor 24 is coupled to the terminal OUT such that the NMOS transistor 24 is driven by a voltage Vdr from the terminal OUT.

The resistors 30 and 31 configure a voltage divider circuit to divide the output voltage Vout, to thereby generate a feedback voltage Vfb that is used in switching the NMOS transistor 24. The feedback voltage Vfb generated at the node at which the resistors 30 and 31 are coupled is applied to the terminal FB.

The resistor 32 and the capacitors 33 and 34 are elements for phase compensation for a stable operation of the AC-DC converter 10 including the power factor correction IC 23 to feedback-control the NMOS transistor 24. The resistor 32 and the capacitor 33 are provided in series between the terminal COMP and the ground, and the capacitor 34 is provided in parallel with them.

<<Current Detection Circuit 40>>

After the NMOS transistor 24 is turned off, the current detection circuit 40 outputs a voltage Va indicating that the current value of the inductor current IL flowing through the inductor 22 reaches substantially zero (hereinafter, "substantially zero" is simply referred to as zero, for convenience). Further, the current detection circuit 40 is provided between a node N1, at which the inductor 22 and the NMOS transistor 24 are coupled, and the ground. Further, the voltage Va corresponds to a voltage Vsw at the node N1, and is applied to the terminal A of the power factor correction IC 23. Note that, in the following embodiments, even when a "circuit" includes one single element, it is referred to as "circuit". Further, the voltage Va corresponds to a "detection voltage".

<<<Current Detection Circuit 40a>>>

Figure 2A:
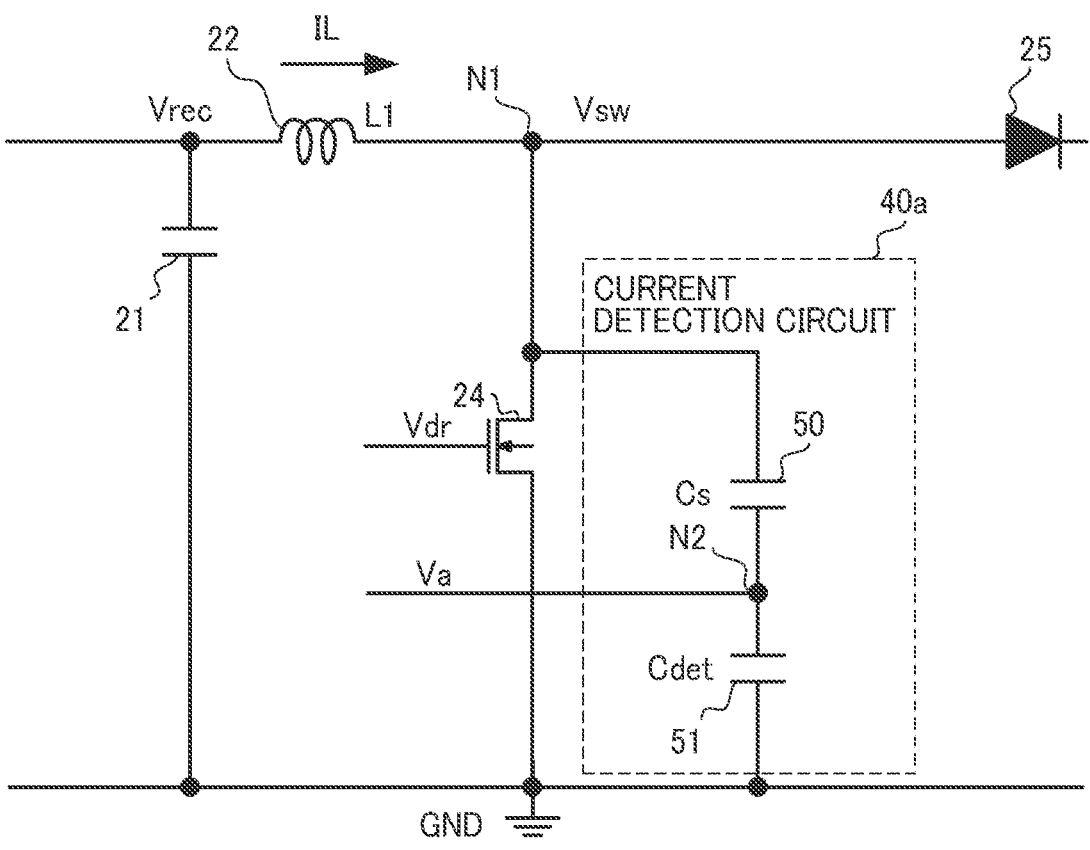

FIG. 2A is a diagram illustrating an example of the current detection circuit 40a, which is an embodiment of the current detection circuit 40. The current detection circuit 40a includes capacitors 50 and 51. The capacitor 50 is coupled to the node N1, and the capacitor 51 is provided between the capacitor 50 and the ground, and is coupled in series with the capacitor 50. Specifically, the capacitor 50 has one terminal coupled to the node N1 and the other terminal coupled to one terminal of the capacitor 51. Further, the other terminal of the capacitor 51 is grounded. Further, a resistor may be provided between the node N1 and the one terminal of the capacitor 50.

Note that the capacitors 50 and 51 configure a voltage divider circuit to divide the voltage Vsw, and the node at which the capacitors 50 and 51 are coupled is referred to as a node N2, and the voltage at the node N2 is the voltage Va. Further, the capacitor 50 corresponds to a "first capacitor", the capacitor 51 corresponds to a "second capacitor", the node N1 corresponds to a "first node", and the node N2 corresponds to a "second node".

In addition, the capacitors 50 and 51 divide the voltage Vsw such that the voltage level of the voltage Va is suppressed within a predetermined range in which the power factor correction IC 23 is detectable, and thus the voltage applied across the capacitor 50 is greater than the voltage Va applied across the capacitor 51. Further, considering that the capacitors 50 and 51 are coupled in series, the charges held by the capacitors 50 and 51 are substantially the same. As a result, the capacitance value Cs of the capacitor 50 is set smaller than the capacitance value Cdet of the capacitor 51. Since the voltage generated across the capacitor 50 is higher than the voltage generated across the capacitor 51, the rated voltage of the capacitor 50 is set higher than the rated voltage of the capacitor 51. Note that the capacitance value Cs corresponds to a "first capacitance value", the capacitance value Cdet corresponds to a "second capacitance value", the rated voltage of the capacitor 50 corresponds to a "first rated voltage", and the rated voltage of the capacitor 51 corresponds to a "second rated voltage".

Figure 2B:
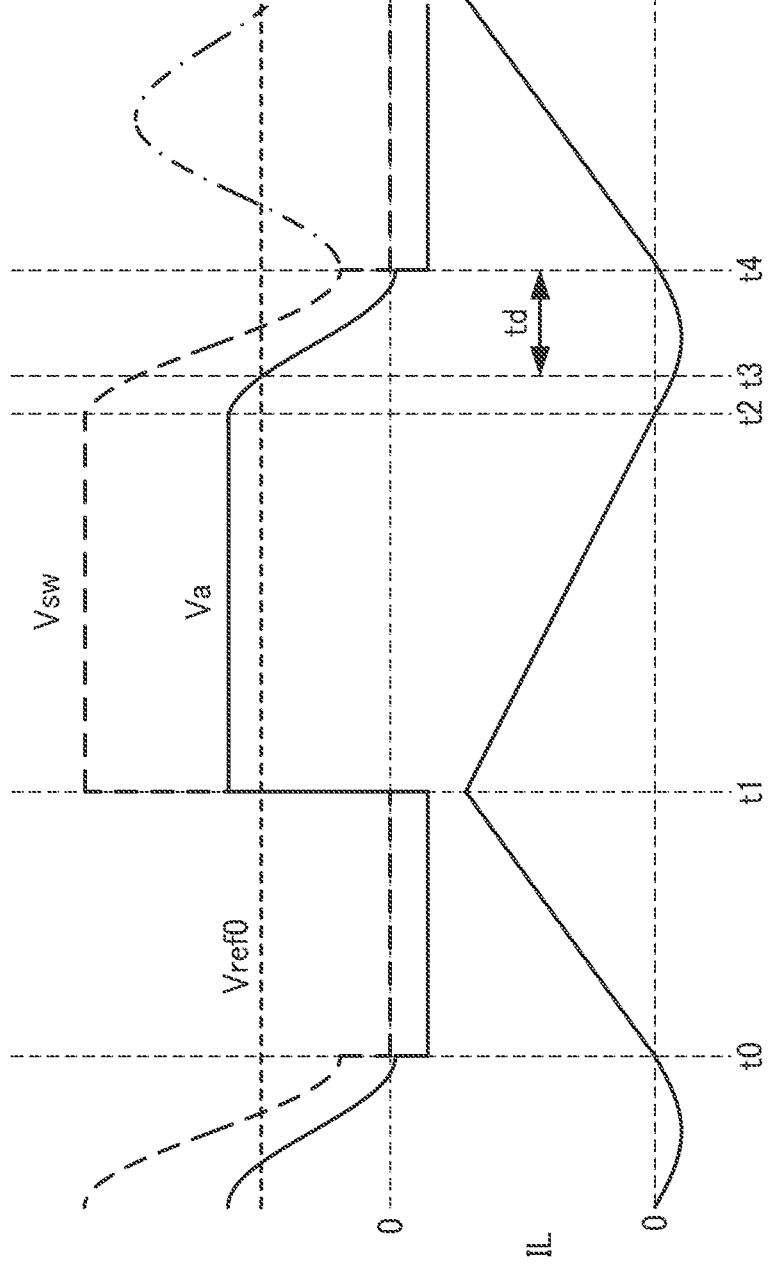
FIG. 2B is a chart illustrating an example of the waveform of the voltage Va.

FIG. 2B is a chart illustrating an example of the waveform of the voltage Va. Although the details of the power factor correction IC 23 will be described later, the power factor correction IC 23 turns on the NMOS transistor 24 after the inductor current IL reaches zero, and turns off the NMOS transistor 24 upon the lapse of the time period corresponding to the feedback voltage Vfb. Further, the power factor correction IC 23 turns on the NMOS transistor 24 at the timing at which the voltage value of the voltage Vsw becomes the minimum value,without turning on the NMOS transistor 24 immediately when the inductor current IL reaches zero.

The power factor correction IC 23 thereby reduces the switching loss of the NMOS transistor 24, which will be described later in detail.

In FIG. 2B, the voltage Vsw given by the dashed-dotted line resonates with the resonance circuit including the inductor 22, the drain-source parasitic capacitance of the NMOS transistor 24, and the capacitors 50, 51, after the inductor current IL reaches zero, which will be described later in detail.

In response to the power factor correction IC 23 turning on the NMOS transistor 24 at time t0, the voltage Vsw given by the dashed line reaches the ground voltage. Further, the voltage Va is a divided voltage of the voltage Vsw, but since the DC level thereof is not uniquely determined, the voltage Va results in the level given by the solid line, for example. Further, the inductor current IL starts to increase with a slope corresponding to the inductance value L1 of the inductor 22 and the voltage Vrec.

At time t1 at which the time period corresponding to the output voltage Vout has elapsed since time t0, the power factor correction IC 23 turns off the NMOS transistor 24. Upon turning off of the NMOS transistor 24, the voltage Vsw rises to the voltage higher than the output voltage Vout by an amount corresponding to the forward voltage VF of the diode 25. Then, the voltage Va results in a voltage obtained by dividing the voltage Vsw, and becomes higher than the reference voltage Vref0 described later. Further, the inductor 22 starts to supply the inductor current IL to the capacitor 26 through the diode 25.

At time t2 after the NMOS transistor 24 is turned off, the inductor current IL supplied from the inductor 22 to the capacitor 26 through the diode 25 reaches zero. As a result, the voltage Vsw starts to drop from the voltage at the turning off of the NMOS transistor 24. In association therewith, the voltage Va also starts to drop.

In response to the inductor current IL reaching zero, the voltage Vsw is influenced by the resonant circuit including the inductor 22, the drain-source parasitic capacitance of the NMOS transistor 24, and the capacitors 50 and 51, for example, and starts to resonate.

Then, at time t3, the voltage Va drops below the reference voltage Vref0. Accordingly, by appropriately setting the reference voltage Vref0, the power factor correction IC 23 can detect that the inductor current IL has decreased to zero after the NMOS transistor 24 is turned off. Note that the reference voltage Vref0 is a reference voltage to detect whether the inductor current IL has reached zero, based on the voltage Va applied to the terminal A, in a comparator circuit 100 (described later) of the power factor correction IC 23.

Further, at time t4 at which a predetermined time period td has elapsed since time t3 and the voltage Vsw becomes the minimum value, the power factor correction IC 23 turns on the NMOS transistor 24. As such, by setting the predetermined period td so as to be able to turn on the NMOS transistor 24 when the voltage Vsw becomes the minimum value, the switching loss of the NMOS transistor 24 can be reduced. Hereinafter, the same or similar operation will be repeated. The details of the operation of the power factor correction IC 23 when the current detection circuit 40a is used will be described later.

<<Configuration of Power Factor Correction IC 23>>

Figure 3:
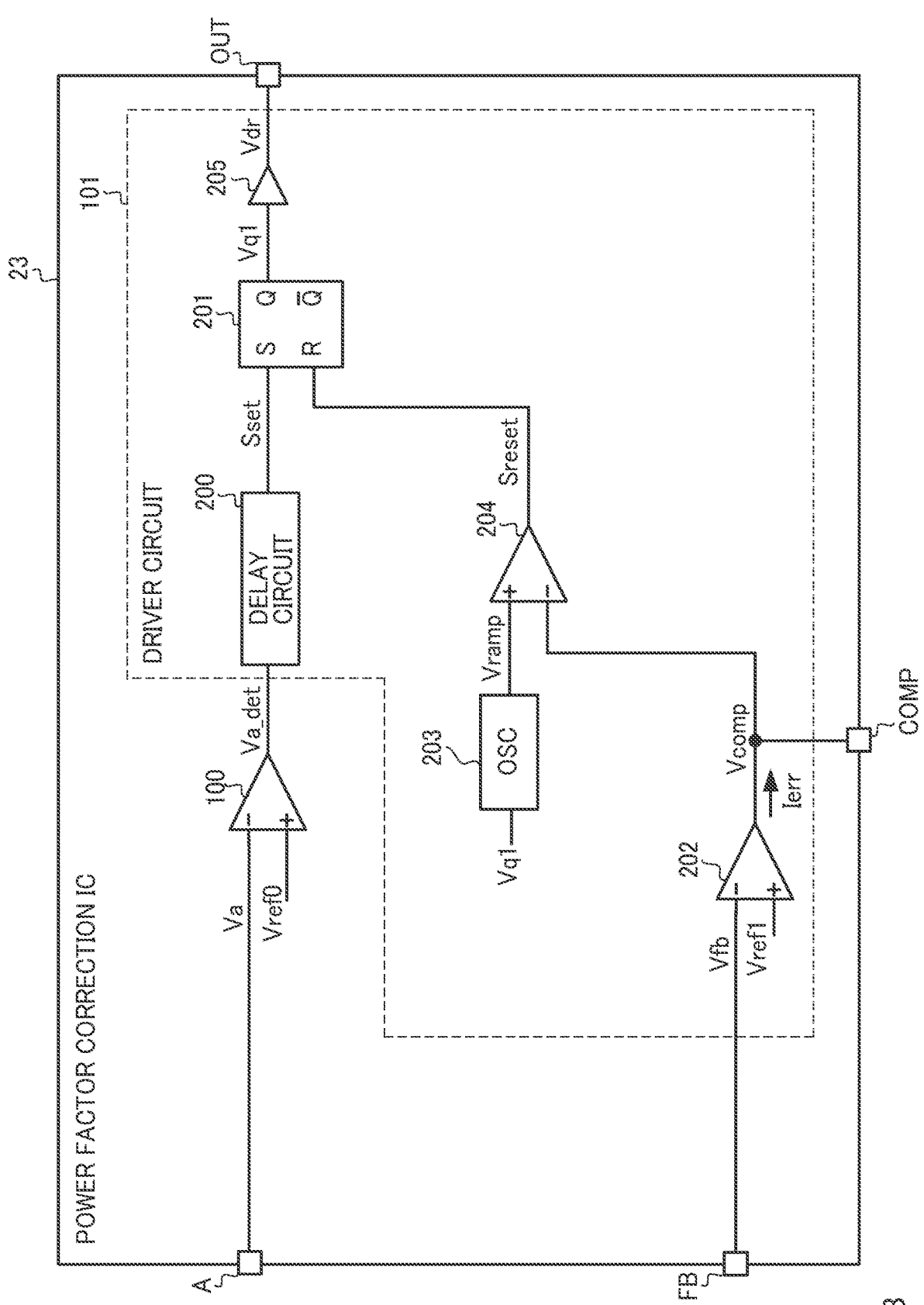
FIG. 3 is a diagram illustrating an example of a power factor correction IC 23.

FIG. 3 is a diagram illustrating an example of the power factor correction IC 23. The power factor correction IC 23 includes the comparator circuit 100 and a driver circuit 101. Note that, in FIG. 3, the terminals are illustrated at positions different from those in FIG. 1 for convenience, but wiring, element(s), and the like are the same between FIG. 1 and FIG. 3.

The comparator circuit 100 detects that the inductor current IL reaches zero, based on the voltage Va at terminal A. Specifically, the comparator circuit 100 compares the voltage Va with the reference voltage Vref0, to thereby output a signal Va_det at a high level (hereinafter, referred to as high or high level), in response to the voltage Va dropping below the reference voltage Vref0, assuming that the inductor current IL reaches zero. Meanwhile, in response to the voltage Va exceeding the reference voltage Vref0, the comparator circuit 100 outputs a signal Va_det at a low level (hereinafter referred to as low or low level).

Note that the signal Va_det corresponds to a "result of comparison".

The driver circuit 101 turns on the NMOS transistor 24 after the inductor current IL reaches zero, and turns off the NMOS transistor 24, based on the feedback voltage Vfb corresponding to the output voltage Vout. Specifically, in response to the comparator circuit 100 outputting the high signal Va_det, the driver circuit 101 turns on the NMOS transistor 24 after the lapse of the predetermined time period td. Further, the driver circuit 101 turns off the NMOS transistor 24, in response to the ramp-wave voltage Vramp from an oscillator circuit 203 (described later) becoming equal to the voltage corresponding to the feedback voltage Vfb.

The driver circuit 101 includes a delay circuit 200, an RS flip-flop 201, an error voltage output circuit 202, the oscillator circuit 203, a comparator circuit 204 and a buffer 205.

The delay circuit 200 outputs a pulse signal Sset to turn on the NMOS transistor 24 after the predetermined time period td has elapsed since the inductor current IL has reached zero. Specifically, the delay circuit 200 outputs the high pulse signal Sset after the predetermined time period td has elapsed since the rising edge of the signal Va_det from the comparator circuit 100. Meanwhile, the delay circuit 200 does not output the pulse signal Sset when the comparator circuit 100 outputs the low signal Va_det.

As a result, the NMOS transistor can be turned on when the voltage Vsw becomes the minimum value after the inductor current IL reaches zero. Accordingly, with the power factor correction IC 23 turning on the NMOS transistor 24 as such, the switching loss of the NMOS transistor 24 is reduced.

The RS flip-flop 201 outputs a driving signal Vq1 to switch the NMOS transistor 24. Specifically, in response to the delay circuit 200 outputting the high pulse signal Sset, the RS flip-flop 201 outputs the high driving signal Vq1 to turn on the NMOS transistor 24. Meanwhile, the RS flip-flop 201 outputs the low driving signal Vq1 to turn off the NMOS transistor 24, in response to the comparator circuit 204 (described later) outputting the high signal Sreset.

The error voltage output circuit 202 generates an error current Ierr corresponding to the error between the reference voltage Vref1 corresponding to the output voltage Vout of the target level and the feedback voltage Vfb, charges the capacitors 33 and 34 through the terminal COMP, and generates a voltage Vcomp.

An oscillator circuit (OSC) 203 generates the oscillator voltage Vramp that is needed in turning off the NMOS transistor 24. Specifically, in response to the inductor current IL reaching zero and the high driving signal Vq1 being received, the oscillator circuit 203 outputs the oscillator voltage Vramp having an amplitude gradually increasing with a predetermined slope.

The comparator circuit 204 compares the voltage Vcomp and the oscillator voltage Vramp, to thereby determine the timing at which the NMOS transistor 24 is turned off. Specifically, the voltage Vcomp is applied to the inverting input terminal of the comparator 204, and the oscillator voltage Vramp is applied to the non-inverting input terminal of the comparator 204. Thus, when the level of the oscillator voltage Vramp is lower than the level of the voltage Vcomp, the comparator 204 outputs the low reset signal Sreset, and when the level of the oscillator voltage Vramp is higher than the level of the voltage Vcomp, the comparator 204 outputs the high reset signal Sreset.

The buffer circuit 205 drives the NMOS transistor 24 in response to the driving signal Vq1. Specifically, the buffer 205 outputs the voltage Vdr to turn on the NMOS transistor 24, in response to the RS flip-flop 201 outputting the high signal Vq1. Meanwhile, the buffer 205 outputs the voltage Vdr to turn off the NMOS transistor 24, in response to the RS flip-flop 201 outputting the low signal Vq1.

<<<Operation of Power Factor Correction IC 23>>>

Figure 4:
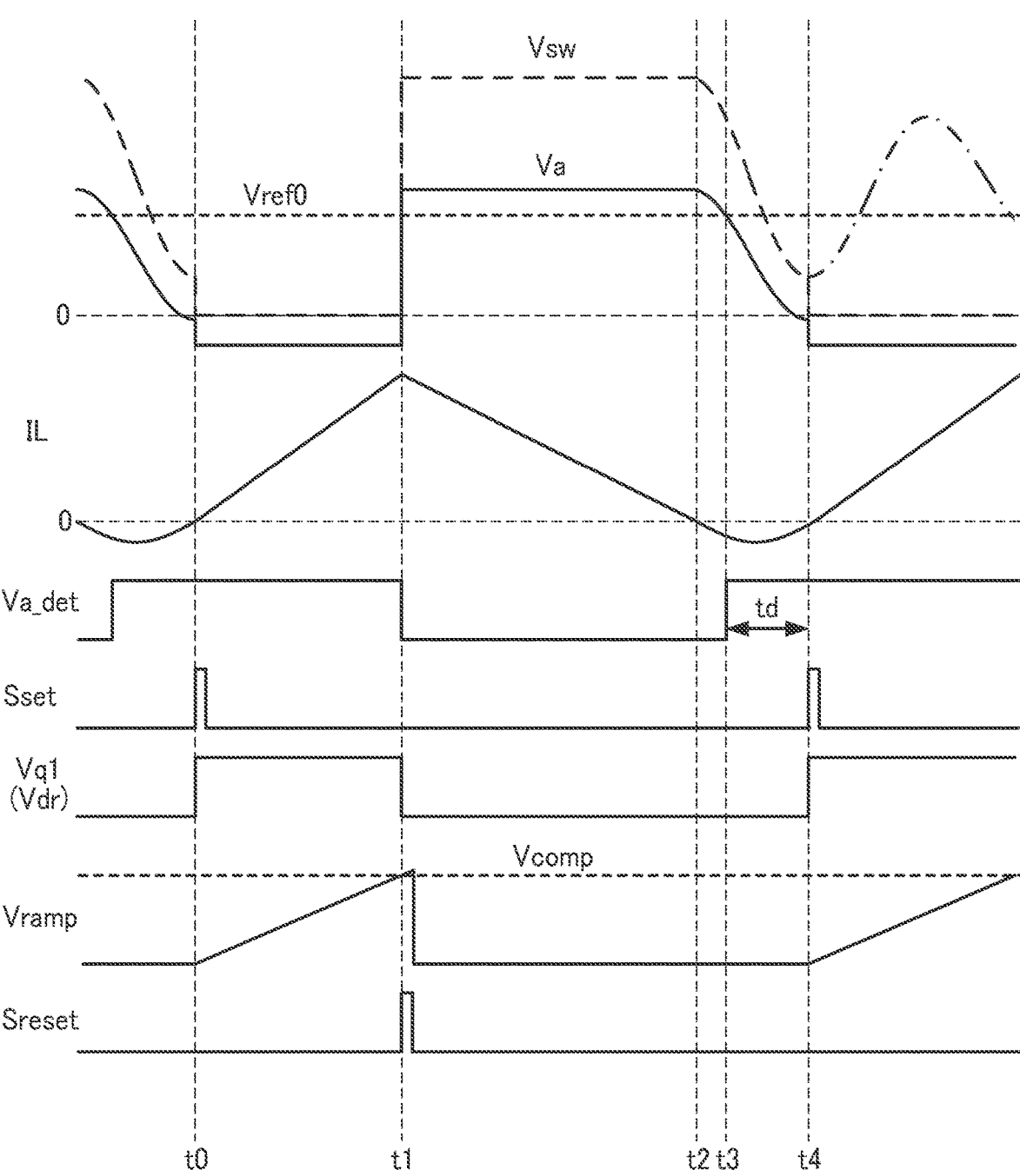
FIG. 4 is a chart illustrating an operation of a power factor correction IC 23.

FIG. 4 is a chart illustrating the operation of the power factor correction IC 23 when the current detection circuit 40a is used as the current detection circuit 40. Note that time t0 to t4 in FIG. 4 correspond to time t0 to t4 in FIG. 2B. Thus, only the operation of the power factor correction IC 23 will be described below.

At time t0 at which the power factor correction IC 23 outputs the voltage Vdr to turn on the NMOS transistor 24, the NMOS transistor 24 is turned on. Upon turning on of the NMOS transistor 24, the oscillator circuit 203 starts outputting the oscillator voltage Vramp with a predetermined slope.

At time t1 at which the oscillating voltage Vramp exceeds the voltage Vcomp, the comparator circuit 204 outputs the high signal Sreset. Then, the RS flip-flop 201 outputs the low signal Vq1, and the buffer 205 outputs the voltage Vdr to turn off the NMOS transistor 24.

The voltage Va drops after time t2 at which the inductor current IL reaches zero, and at time t3 at which the voltage Va becomes equal to the reference voltage Vref0, the comparator circuit 100 outputs the high signal Va_det.

At time t4 at which the predetermined time period td has elapsed since time t3, the delay circuit 200 outputs the high pulse signal Sset. In response to the delay circuit 200 outputting the high pulse signal Sset, the RS flip-flop 201 outputs the high drive signal Vq1, and the buffer 205 outputs the voltage Vdr to turn on the NMOS transistor 24. Then, the NMOS transistor 24 is turned on. Thereafter, the same or similar operations are repeated.

By operating as such, the AC-DC converter 10 is able to perform a power factor correcting operation in the critical operation mode, without using a transformer that includes an auxiliary winding.

Modifications

In the case of the current detection circuit 40a, the capacitors 50 and 51 are coupled in series, and the level of the DC voltage at the node at the coupling point at which the capacitors 50 and 51 are coupled is not determined. Thus, it may be difficult to set the DC level of the voltage Va to a desired level. Thus, a description will be given of a current detection circuit 40b capable of appropriately setting the DC level of the voltage Va.

<<Current Detection Circuit 40b>>

Figure 5A:
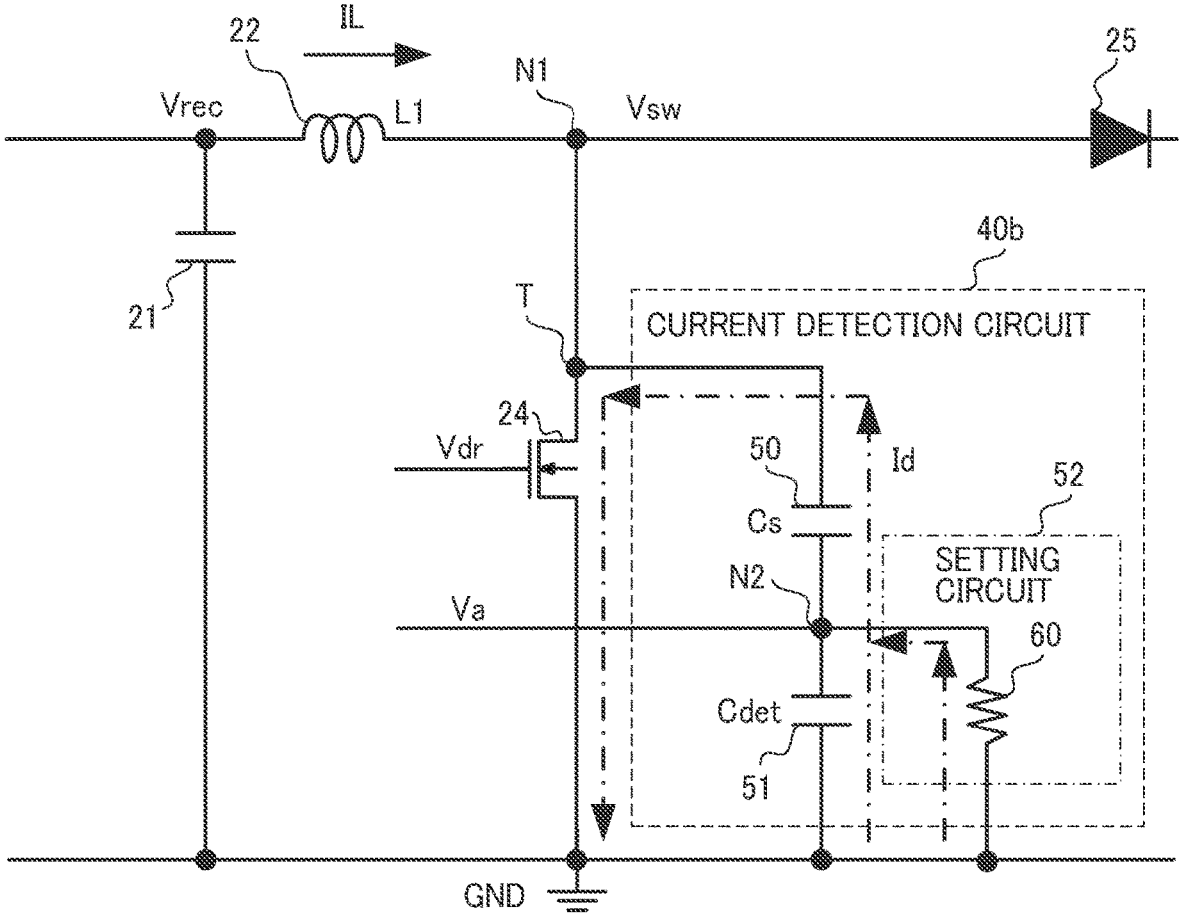
FIG. 5A is a diagram illustrating an example of a current detection circuit 40b.

FIG. 5A is a diagram illustrating an example of the current detection circuit 40b, which is an embodiment of the current detection circuit 40. The current detection circuit 40b includes the capacitors 50 and 51 and a setting circuit 52. The setting circuit 52 is a circuit to set the DC level of voltage Va, and is provided between the node N2 and the ground. Specifically, the setting circuit 52 is provided between the ground and the node at which the other terminal of the capacitor 50 and the one terminal of the capacitor 51 are coupled.

Further, in an embodiment of the present disclosure, the setting circuit 52 is a resistor 60. Specifically, the resistor 60 has one terminal coupled to the node at which the other terminal of the capacitor 50 and the one terminal of the capacitor 51 are coupled, and the resistor 60 has the other terminal that is grounded. The resistor 60 being provided between the node N2 and the ground can cause the DC level of the voltage Va to be the ground voltage. In other words, the resistor 60 is, for example, an element to regulate the average voltage of the capacitor 51 to the ground voltage.

Note that the time constant of the RC parallel circuit including the capacitor 51 and the resistor 60 is set sufficiently longer than the switching period of the NMOS transistor 24. With the average voltage of the capacitor 51 being set as such, it approaches the ground voltage over the time period longer than several switching periods. The following describes the operation of the current detection circuit 40b in a steady state after the time period longer than several switching periods has elapsed.

Figure 5B:
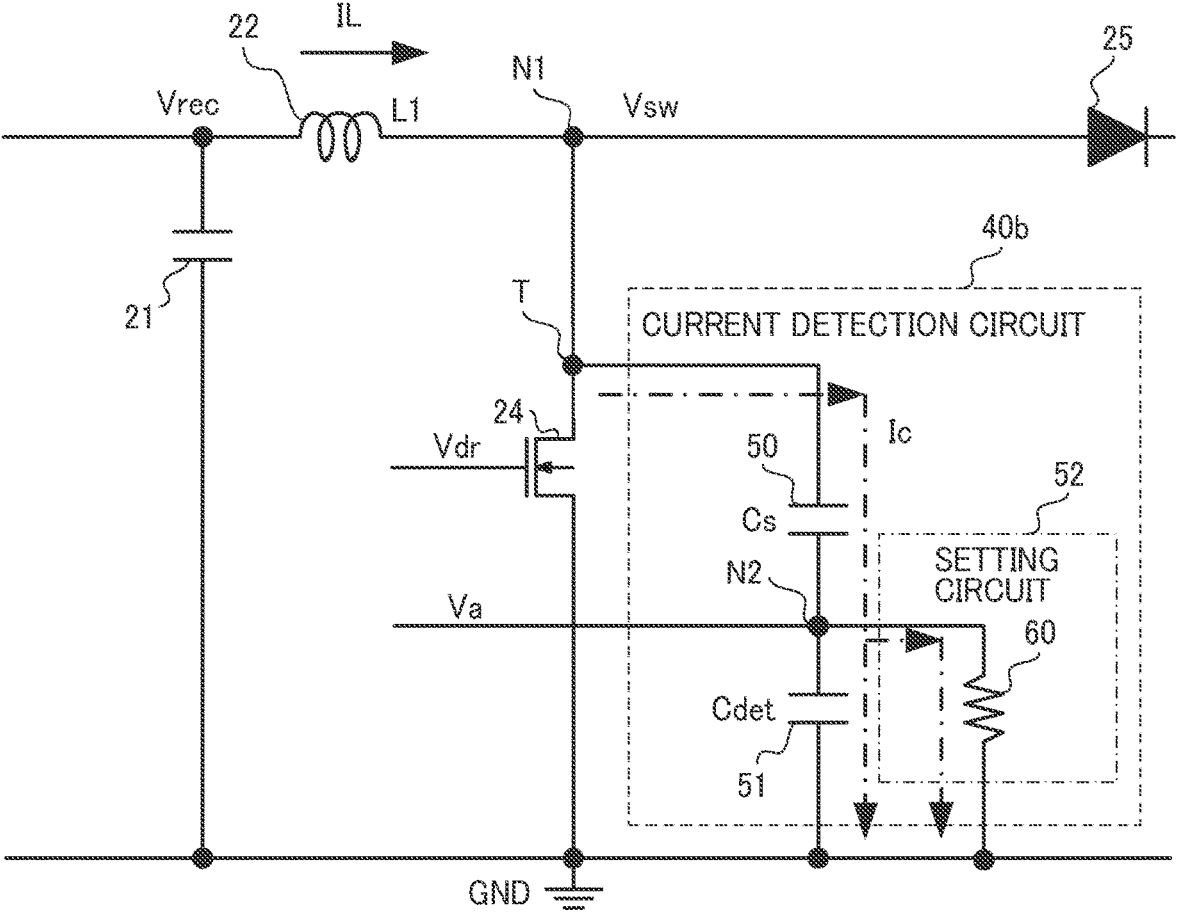
FIG. 5B is a diagram illustrating an example of a current detection circuit 40b.

Upon turning on of the NMOS transistor 24, the current Id flows through the current detection circuit 40b as given by the dashed-dotted arrow in FIG. 5A, which will be described later. Similarly, upon turning off of the NMOS transistor 24, the current Ic flows through the current detection circuit 40b as given by the dashed-dotted arrow in FIG. 5B. Note that the currents Id and Ic flowing through the current detection circuit 40b with turning on/off of the NMOS transistor 24 will be described below with reference to FIG. 5C.

Figure 5C:
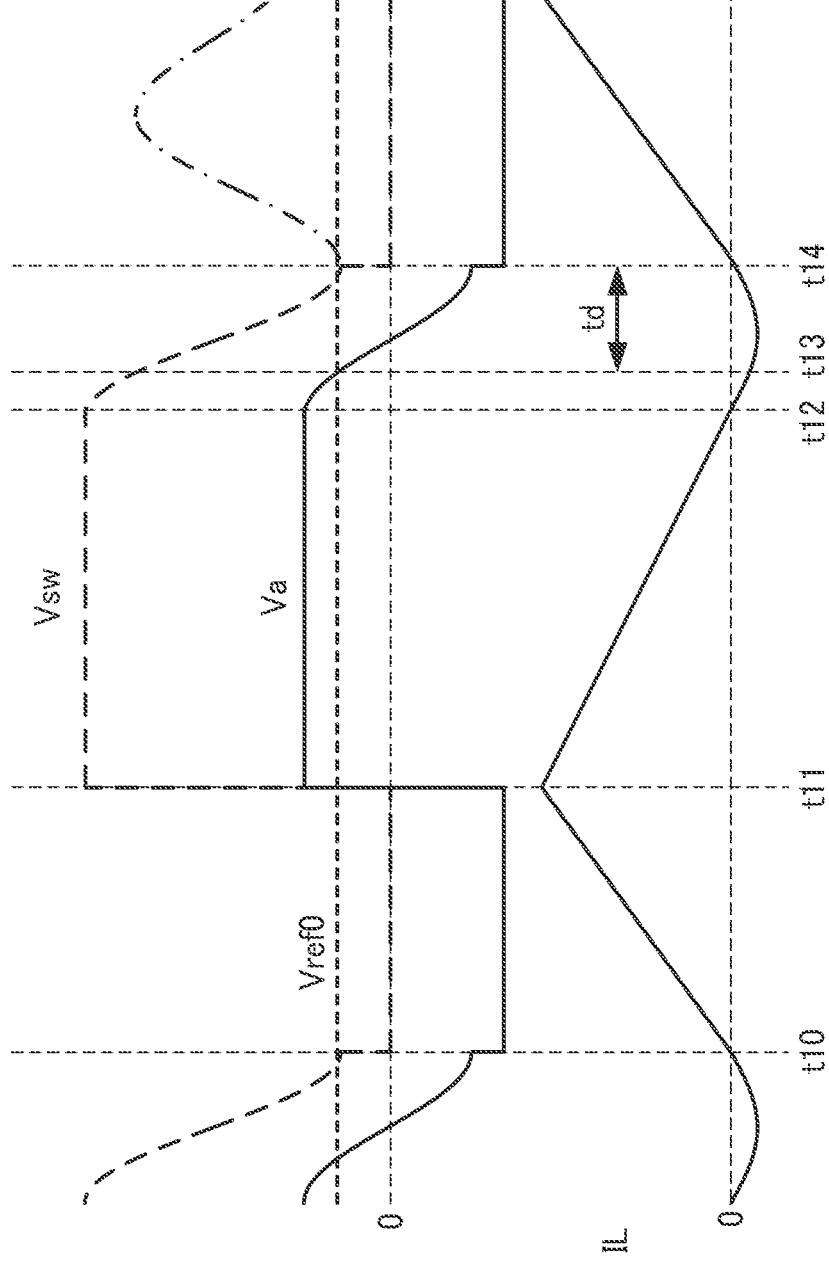
FIG. 5C is a chart illustrating a waveform example of a voltage Va.

FIG. 5C is a chart illustrating an example of the waveform of the voltage Va. Note that time t10 to time t14 in FIG. 5C correspond to time t0 to time t4 in FIG. 2B. Thus, the operation of the power factor correction IC 23 from time t10 to time t14 is the same as the operation of the power factor correction IC 23 from time t0 to time t4. Further, the following describes only the time t10 and t11 at which the current flowing through the current detection circuit 40b changes. Hereinafter, the terminal of the capacitor 50 corresponding to the node at which the NMOS transistor 24 and the capacitor 50 are coupled is referred to as terminal T.

In response to the power factor correction IC 23 turning on the NMOS transistor 24 at time t1, the inductor current IL flows from the node N1 through the NMOS transistor 24 to the ground. Along with this, the on-resistance of the NMOS transistor 24 decreases, and thus the voltage at the terminal T of the capacitor 50 results in the ground voltage.

In an embodiment of the present disclosure, the time constant of the capacitor 51 and the resistor 60 is designed to be longer than the switching period of the NMOS transistor 24, and the charges of the capacitors 50 and 51 are discharged through the NMOS transistor 24 by the current Id of FIG. 5A. In this event, the current flows through the path of the resistor 60, the capacitor 50, and the NMOS transistor 24 as well.

At time t11 at which the time period corresponding to the output voltage Vout has elapsed since time t10, the power factor correction IC 23 turns off the NMOS transistor 24. Upon turning off of the NMOS transistor 24, the voltage Vsw rises. The voltage Vsw having risen is applied to the terminal T of the capacitor 50, and the capacitors 50 and 51 are charged by the current Ic of FIG. 5B. In this event, the current flows through the path of the capacitor 50 and the resistor 60 as well. As a result, the voltage Va exceeds the reference voltage Vref0.

As such, with the node N2 being coupled to the ground through the resistor 60, the DC level of the node N2, at which the capacitors 50 and 51 are coupled, results in the level of the ground voltage. Thus, the levels of the maximum voltage and the minimum voltage of the voltage Va are determined, such that the sum of the time integral of the voltage Va while it is positive and the time integral of the voltage Va while it is negative is zero.

Further, the average value of the voltage Vsw, in other words, the DC level when considering the AC component of the voltage Vsw, results in the rectified voltage Vrec. Under the conditions that the rectified voltage Vrec is 265 Vrms at the maximum and the output voltage Vout is 390 V, the lowest value of the maximum voltage of the voltage Vsw results in $390 - 265\sqrt{2} = 16$ V, and the smallest value of the minimum voltage results in −374 V. Accordingly, assuming that the DC level of the voltage Va is the ground voltage, the lowest value of the maximum voltage of the voltage Va is a voltage value obtained by dividing 16 V by the voltage division ratio of the capacitors 50 and 51. Meanwhile, the smallest value of the minimum voltage of the voltage Va is a voltage value obtained by dividing −374 V by the voltage division ratio of the capacitors 50 and 51. Accordingly, in an embodiment of the present disclosure, the reference voltage Vref0 used in the comparator circuit 100 of FIG. 3 is set smaller than the lowest value of the maximum voltage of the voltage Va.

<<Current Detection Circuit 40c>>

Figure 6A:
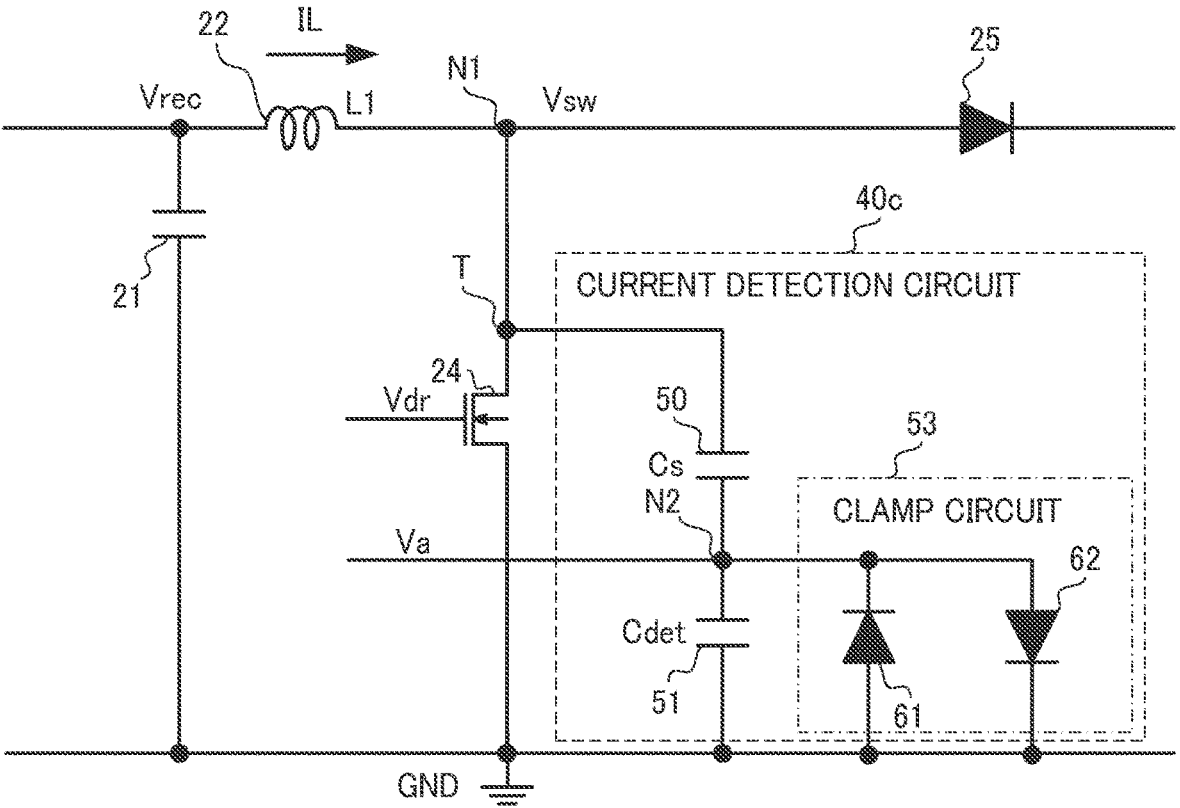
FIG. 6A is a diagram illustrating an example of a current detection circuit 40c.

FIG. 6A is a diagram illustrating a current detection circuit 40c, which is an embodiment of the current detection circuit 40. The current detection circuit 40c includes the capacitors 50 and 51 and a clamp circuit 53. Further, the clamp circuit 53 is a circuit corresponding to a "setting circuit", and is provided between the node N2 and the ground.

Specifically, the clamp circuit 53 includes a diode 61 having an anode coupled to the ground and a cathode coupled to the node N2, and a diode 62 having a cathode coupled to the ground and an anode coupled to the node N2. Specifically, the cathode of the diode 61 and the anode of the diode 62 are coupled to the node at which the other terminal of the capacitor 50 and the one terminal of the capacitor 51 are coupled, and the anode of the diode 61 and the cathode of the diode 62 are coupled to the ground. In other words, in the clamp circuit 53, the diodes 61 and 62 are coupled in anti-parallel.

With the diodes 61 and 62 being coupled in anti-parallel, the voltage level of the voltage Va can be clamped between the forward voltage of the diode 61 and the forward voltage of the diode 62 when the NMOS transistor 24 is turned on and off. Note that "coupling in anti-parallel" refers to a state in which two diodes are coupled to each other, with the forward direction of one diode thereof being opposite to the forward direction of the other diode thereof. Further, the diode 61 corresponds to a "third diode", and the diode 62 corresponds to a "first diode" and a "second diode".

Figure 6B:
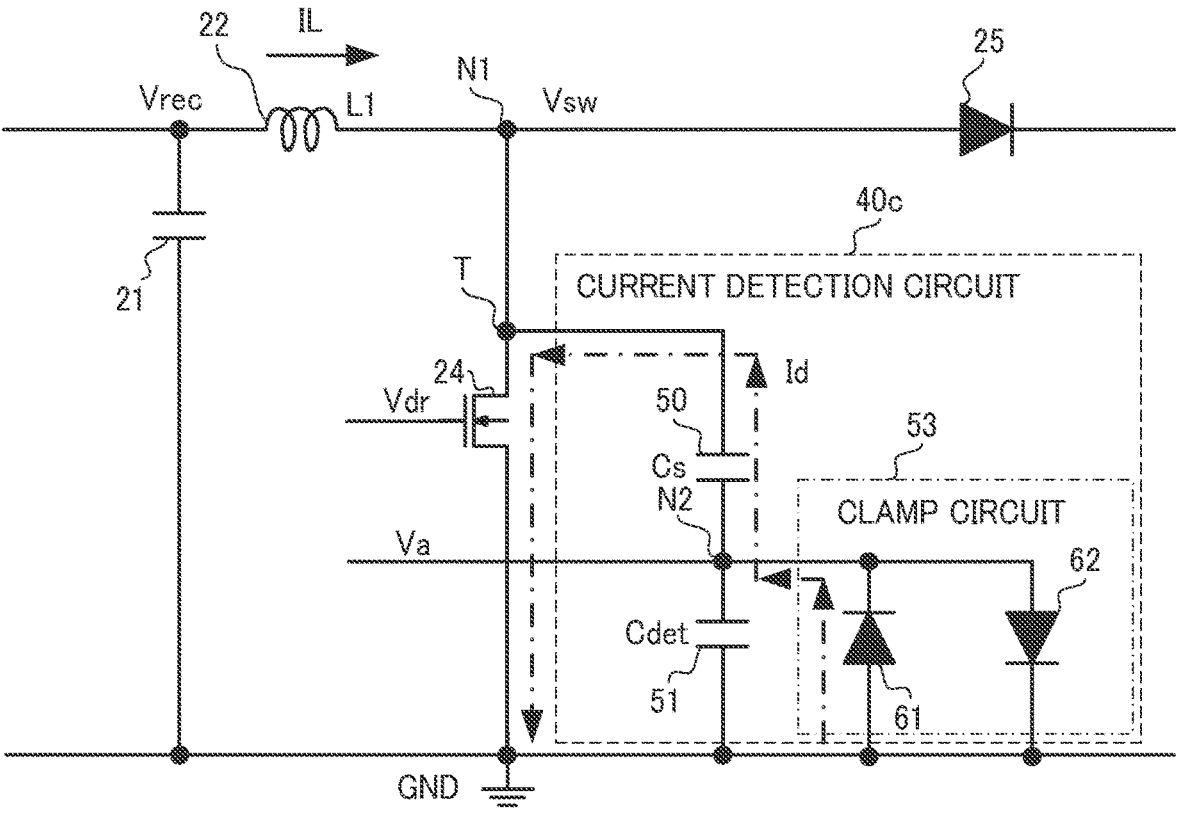
FIG. 6B is a diagram illustrating an example of a current flowing through a current detection circuit 40c.

Further, upon turning on of the NMOS transistor 24, a current flows, as with the current Id in FIG. 6B, through the current detection circuit 40c. In this event, the voltage Va drops to the minimum voltage that is lower than the ground voltage by an amount corresponding to the forward voltage VF of the diode 61.

Figure 6C:
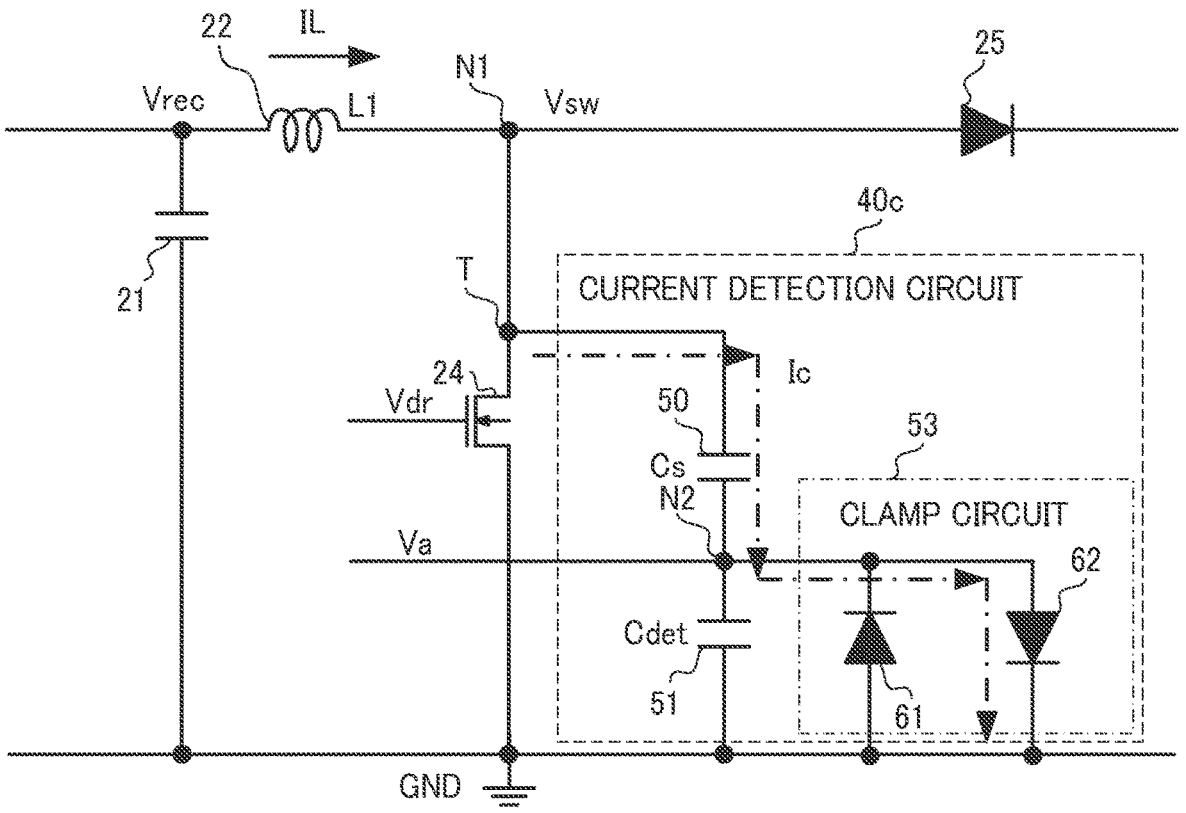
FIG. 6C is a diagram illustrating an example of a current flowing through a current detection circuit 40c.

Similarly, upon turning off of the NMOS transistor 24, a current flows, as with the current Ic in FIG. 6C, through the current detection circuit 40c. In this event, the voltage Va results in the maximum voltage, which is the forward voltage VF of the diode 62. The current flowing through the current detection circuit 40c with turning on/off of the NMOS transistor 24 will be described later with reference to FIG. 6D.

Further, the maximum voltage that is the forward voltage VF of the diode 62 corresponds to a "first level", and the minimum voltage that is the forward voltage VF of the diode 61 corresponds to a "second level".

Figure 6D:
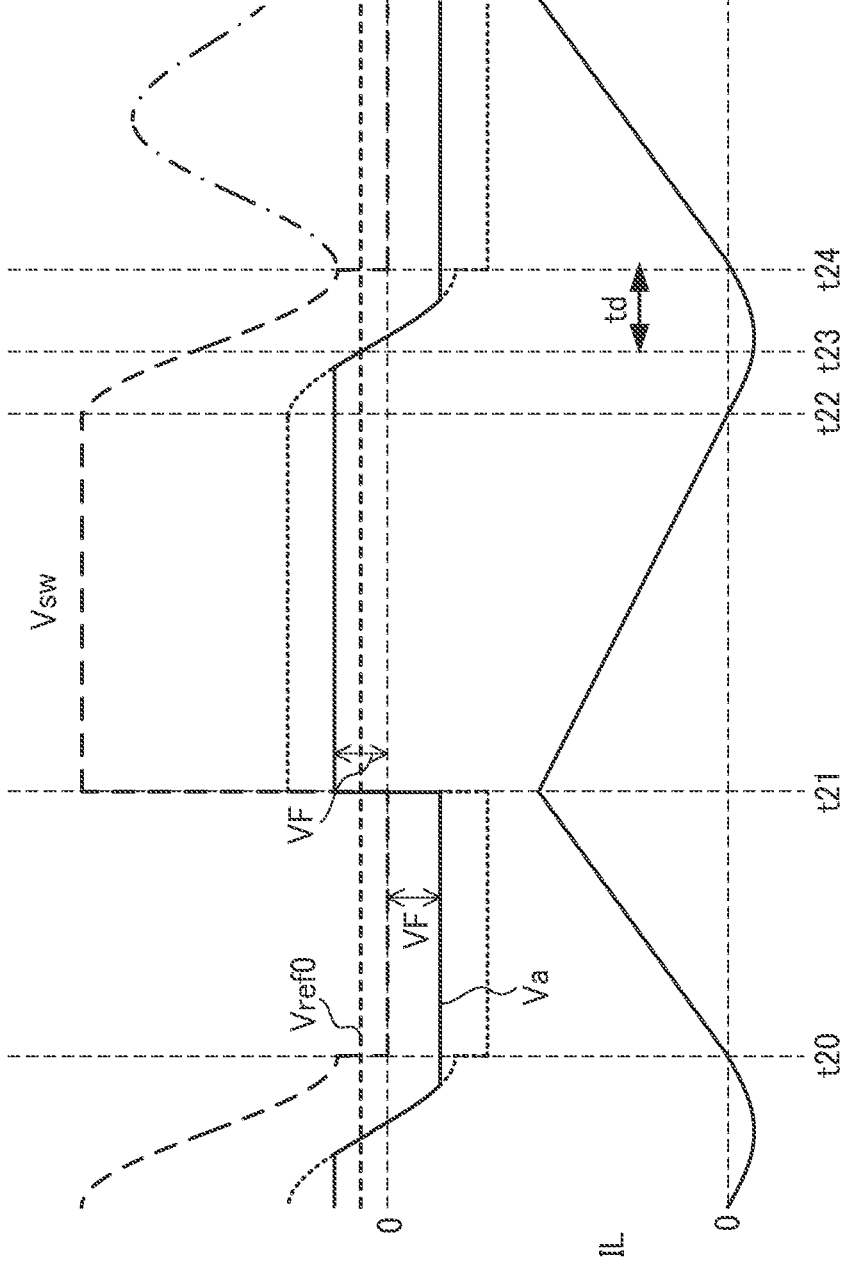
FIG. 6D is a chart illustrating a waveform example of a voltage Va.

FIG. 6D is a chart illustrating an example of the waveform of the voltage Va. Note that time t20 to time t24 in FIG. 6D correspond to time t0 to time t4 in FIG. 2B. Thus, the operation of the power factor correction IC 23 from time t20 to time t24 is the same as the operation of the power factor correction IC 23 from time t0 to time t4. Further, the following describes only the time t20 and t21 at which the current flowing through the current detection circuit 40c changes.

In response to the power factor correction IC 23 turning on the NMOS transistor 24 at time t20, the inductor current IL flows from the node N1 through the NMOS transistor 24 to the ground.

Along with this, the on-resistance of the NMOS transistor 24 decreases, and thus the voltage at the terminal T of the capacitor 50 results in the ground voltage. As a result, the charges in the capacitors 50 and 51 are discharged through the NMOS transistor 24. In this event, a current flows through the path of the diode 61, the capacitor 50, and the NMOS transistor 24 as well, as with the current Id in FIG. 6B. Thus, the level of the voltage Va is clamped to the voltage that has dropped lower than the ground voltage by an amount corresponding to the forward voltage VF of the diode 61.

At time t21 at which a time period corresponding to the output voltage Vout has elapsed since time t20, the power factor correction IC 23 turns off the NMOS transistor 24. Upon turning off of the NMOS transistor 24, the voltage Vsw rises. The voltage Vsw having risen is applied to the terminal T of the capacitor 50, and the capacitors 50 and 51 are charged. In this event, a current flows through the path of the capacitor 50 and the diode 62 as well, as with the current Ic in FIG. 6C. As a result, the voltage Va exceeds the reference voltage Vref0. However, the level of voltage Va is clamped to the forward voltage VF of the diode 62.

Further, in an embodiment of the present disclosure, the reference voltage Vref0 in the comparator circuit 100 in FIG. 3 is set lower than the forward voltage VF in the diode 62. Furthermore, in an embodiment of the present disclosure, the voltage division ratio of the voltage divider circuit of the capacitors 50, 51 is set such that the voltage Va is higher than the forward voltage VF of the diode 62 when the NMOS transistor 24 is turned off. Accordingly, after the NMOS transistor 24 is turned off and the inductor current IL reaches zero, the voltage Va changes from the forward voltage VF to the level lower than the reference voltage Vref0. As a result, in an embodiment of the present disclosure, it is possible to cause the power factor correction IC 23 to detect that the inductor current IL reaches zero, by virtue of the voltage Va dropping below the reference voltage Vreqf0. In this case, the capacitor 51 functions as an element to stabilize the voltage Va mainly.

<<Current Detection Circuit 40*d*>>

Figure 7A:
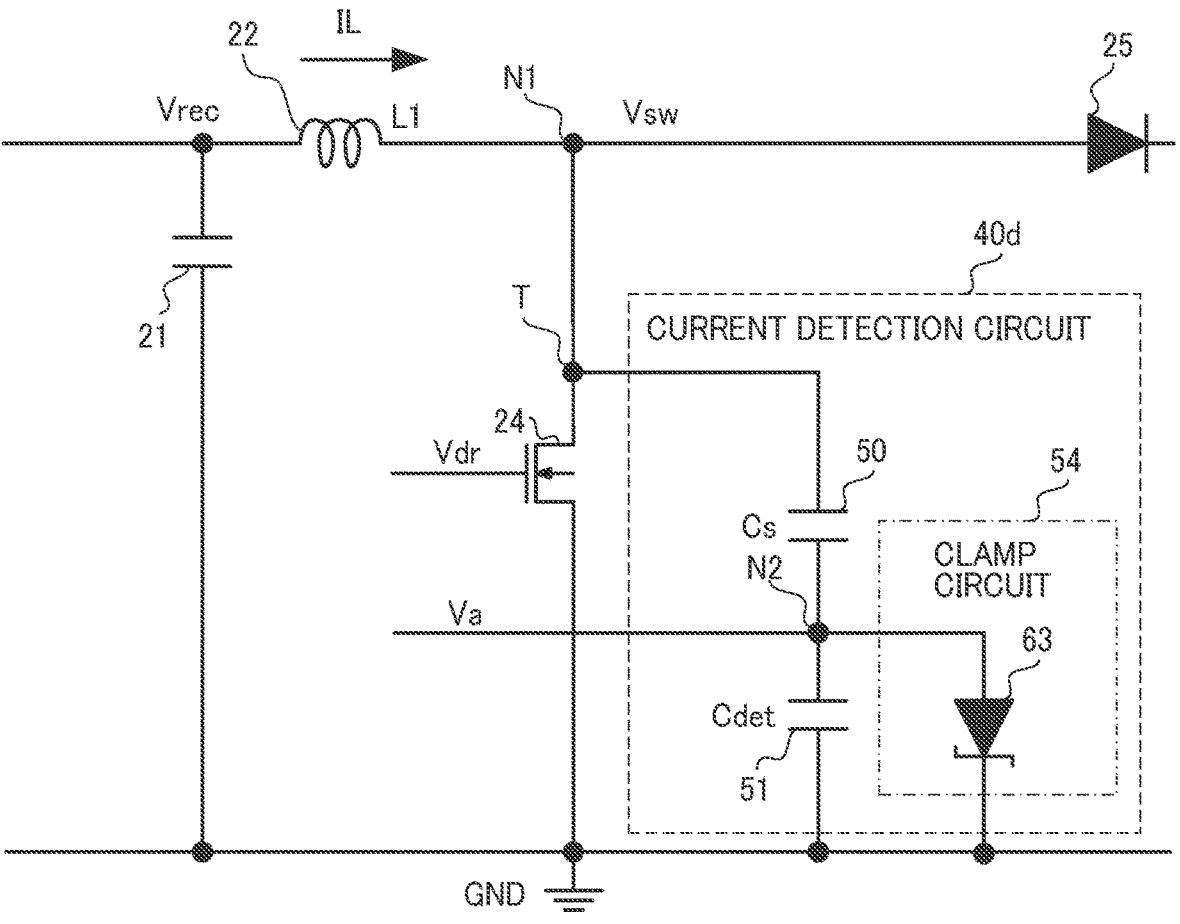
FIG. 7A is a diagram illustrating an example of a current detection circuit 40d.

FIG. 7A is a chart illustrating an example of a current detection circuit 40*d*, which is an embodiment of the current detection circuit 40. The current detection circuit 40*d* includes the capacitors 50, 51 and a clamp circuit 54. The clamp circuit 54 corresponds to the "setting circuit", and is provided between the node N2 and the ground. Specifically, the clamp circuit 54 includes a Zener diode 63 having a cathode coupled to the ground and an anode coupled to the node N2 (i. e. , the node at which the other terminal of the capacitor 50 and the one terminal of the capacitor 51 are coupled.

Figure 7B:
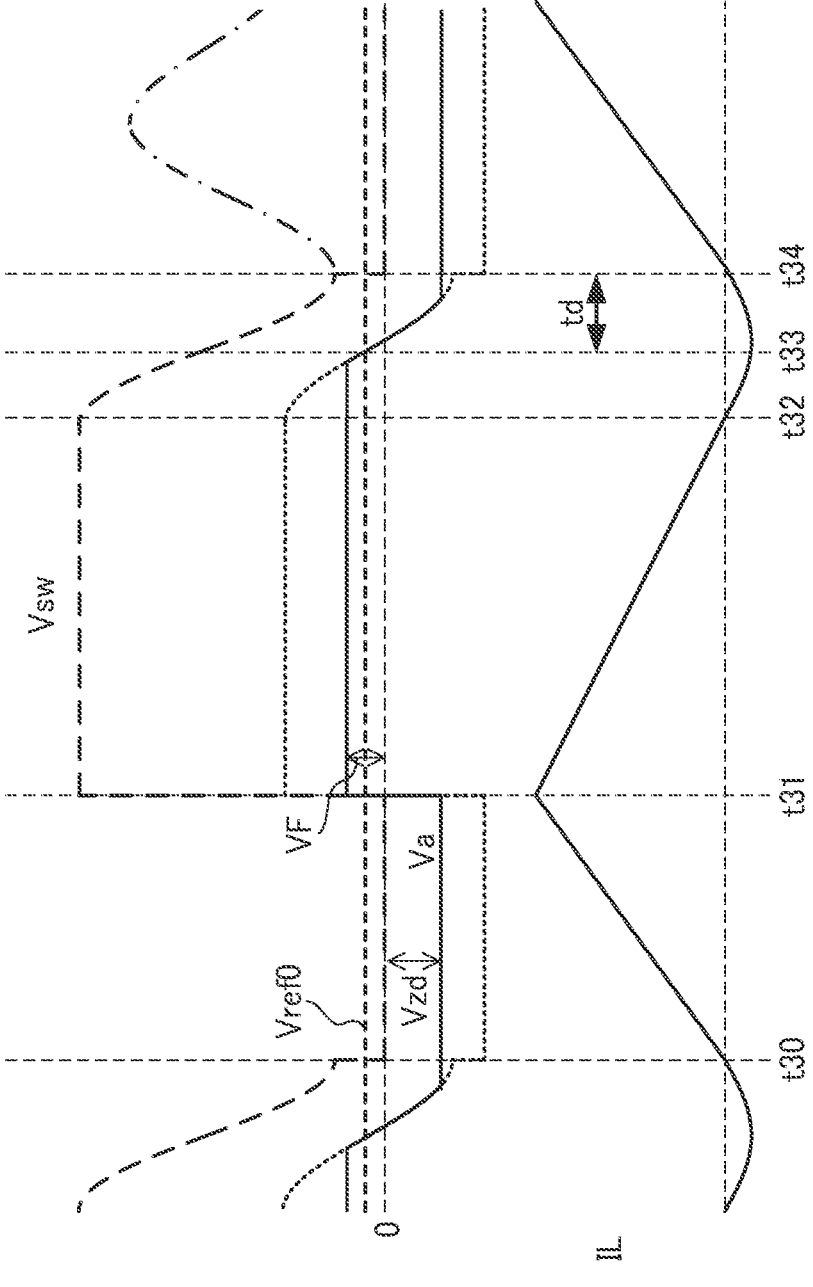
FIG. 7B is a chart illustrating a waveform example of a voltage Va.

FIG. 7B is a chart illustrating an example of the waveform of the voltage Va. Note that time t30 to time t34 in FIG. 7B correspond to time t0 to time t4 in FIG. 2B. Thus, the operation of the power factor correction IC 23 from time t30 to time t34 is the same as the operation of the power factor correction IC 23 from time t0 to time t4. The following describes only time t30 and t31 at which the current flowing through the current detection circuit 40*d* changes.

In response to the power factor correction IC 23 turning on the NMOS transistor 24 at time t30, the inductor current IL flows from the node N1 through the NMOS transistor 24 to the ground. Along with this, the on-resistance of the NMOS transistor 24 decreases, and thus the voltage at the terminal T of the capacitor 50 results in the ground voltage. As a result, the charges of the capacitors 50 and 51 are discharged through the NMOS transistor 24. In this event, a reverse current flows through the Zener diode 63, and a current flows through the path of the Zener diode 63, the capacitor 50, and the NMOS the transistor 24 as well. Thus, the level of the voltage Va is clamped to a Zener voltage Vzd of the Zener diode 63. In this event, the voltage Va drops to the minimum voltage that is lower than the ground voltage by an amount corresponding to the Zener voltage Vzd of the Zener the diode 63.

At time t31 at which a time period corresponding to the output voltage Vout has elapsed since time t30, the power factor correction IC 23 turns off the NMOS the transistor 24. Upon turning off of the NMOS the transistor 24, the inductor current IL does not flow from the node N1 through the NMOS transistor 24 to the ground. Thus, the voltage Vsw rises. The voltage Vsw having risen is applied to the terminal T of the capacitor 50, so that the capacitors 50 and 51 are charged. In this case, the current flows through the path of the capacitor 50 and the Zener diode 63 as well. As a result, the voltage Va exceeds the reference voltage Vref0. However, the level of voltage Va is clamped to the forward voltage VF of the Zener diode 63. In this event, the voltage Va becomes the maximum voltage that is the forward voltage VF of the Zener diode 63.

Further, in an embodiment of the present disclosure, the reference voltage Vref0 in the comparator circuit 100 of FIG. 3 is set lower than the forward voltage VF of the Zener diode 63. Note that when only the diode 62 in FIG. 6A is used instead of the Zener diode 63, the voltage Va when the NMOS the transistor 24 is turned off may not be a positive voltage.

That is, in the case where the voltage Va continues to be a negative voltage, without becoming a positive voltage, when the NMOS transistor 24 is off, it may be erroneously determined that the inductor current IL reaches zero, due to the leakage current of the capacitor 50, 51. Accordingly, even if the voltage obtained by dividing the voltage Vsw (i. e. , voltage Va) becomes a negative voltage as in an embodiment of the present disclosure, it becomes easier to make the voltage Va positive when the AC component of the voltage Vsw rises by restraining the voltage from becoming lower than the Zener voltage Vzd.

Note that the maximum voltage that is the forward voltage VF of the Zener diode 63 corresponds to the "first level", and the minimum voltage that has dropped lower than the ground voltage by an amount corresponding to the Zener voltage Vzd of the Zener diode 63 corresponds to the "second level".

<<Current Detection Circuit 40*e*>>

Figure 8A:
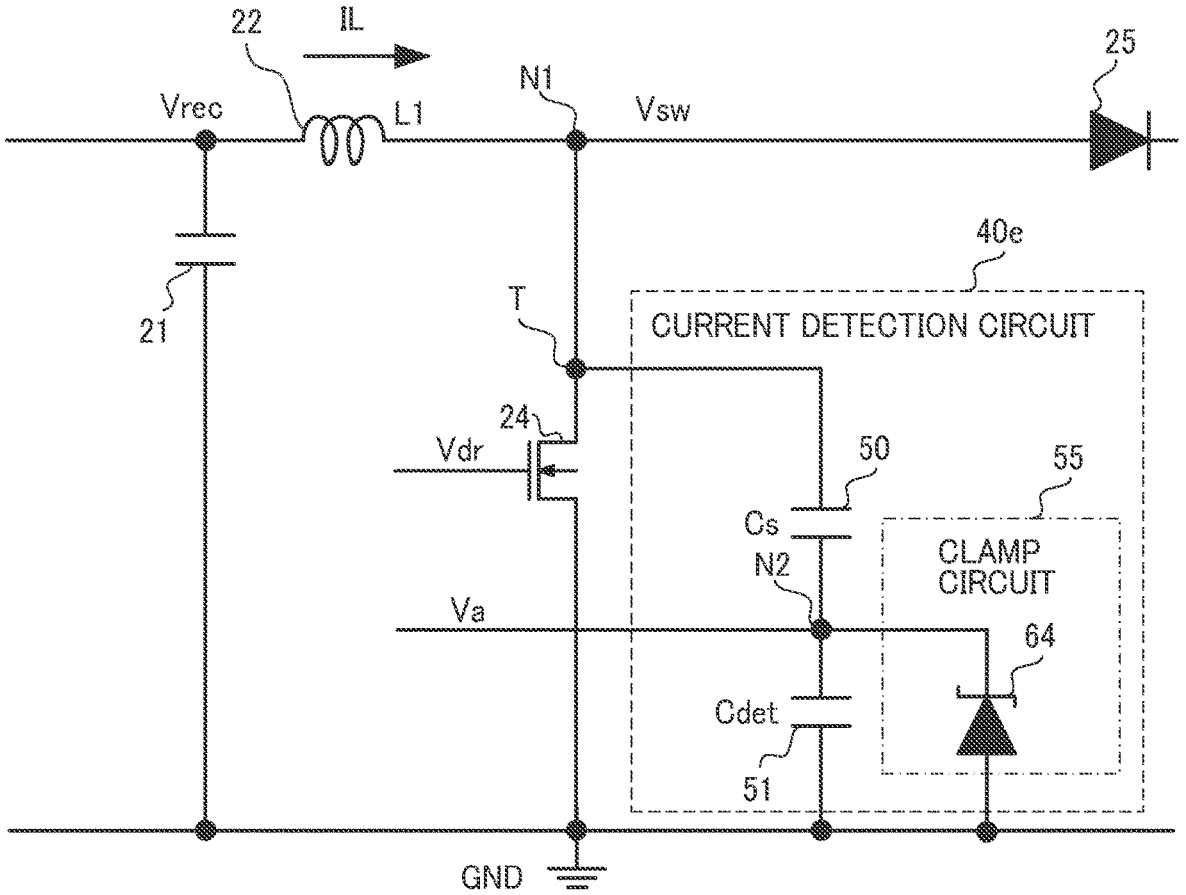
FIG. 8A is a diagram illustrating an example of a current detection circuit 40e.

FIG. 8A is a diagram illustrating an example of a current detection circuit 40*e*, which is an embodiment of the current detection circuit 40. The current detection circuit 40*e* includes the capacitors 50 and 51 and a clamp circuit 55. The clamp circuit 55 corresponds to the "setting circuit", and is provided between the node N2 and the ground. Specifically, the clamp circuit 55 includes a Zener diode 64 having a cathode coupled to the node N2 (i. e. , the node at which the other terminal of the capacitor 50 and the one terminal of the capacitor 51 are coupled) and an anode coupled to the ground.

Figure 8B:
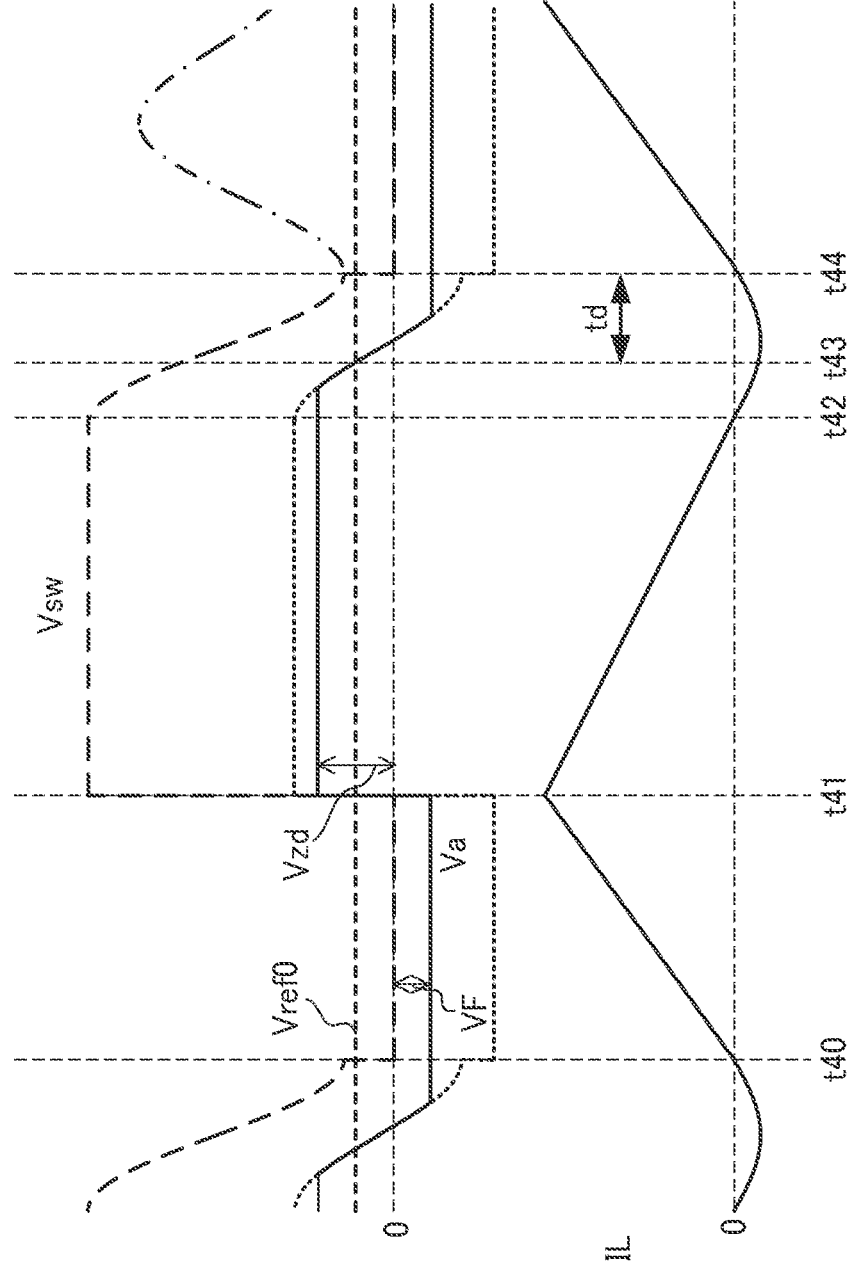
FIG. 8B is a chart illustrating a waveform example of a voltage Va.

FIG. 8B is a chart illustrating an example of the waveform of the voltage Va. Note that time t40 to time t44 in FIG. 8B correspond to time t0 to time t4 in FIG. 2B. Thus, the operation of the power factor correction IC 23 from time t40 to time t44 is the same as the operation of the power factor correction IC 23 from time t0 to time t4. Further, the following describes only time t40 and t41 at which the current flowing through the electric current detection circuit 40*e* changes.

In response to the power factor correction IC 23 turning on the NMOS transistor 24 at time t40, the inductor current IL flows from the node N1 through the NMOS transistor 24 to the ground.

Along with this, the on-resistance of the NMOS transistor 24 decreases, and thus the voltage at the terminal T of the capacitor 50 results in the ground voltage. As a result, the charges of the capacitors 50 and 51 are discharged through the NMOS transistor 24. In this event, a current flows through the path of the Zener diode 64, the capacitor 50, and the NMOS transistor 24 as well. Thus, the level of voltage Va is clamped to the forward voltage VF of the Zener diode 64. In this event, the voltage Va drops to the minimum voltage that is lower than the ground voltage by an amount corresponding to the forward voltage VF of the Zener diode 64.

At time t41 at which the time period corresponding to the output voltage Vout has elapsed since time t40, the power factor correction IC 23 turns off the NMOS transistor 24. Upon turning off of the NMOS transistor 24, the inductor current IL does not flow from the node N1 through the NMOS transistor 24 to the ground. Thus, the voltage Vsw rises. The voltage Vsw having risen is applied to the terminal T of the capacitor 50, so that the capacitors 50 and 51 are charged. In this event, a reverse current flows through the Zener diode 64, and a current flows through the path of the capacitor 50 and the Zener diode 64 as well. As a result, the voltage Va exceeds the reference voltage Vref0. However, the level of voltage Va is clamped to the Zener voltage Vzd of the Zener diode 64. In this event, the voltage Va becomes the maximum voltage that is the Zener voltage Vzd of the Zener diode 64.

Further, in an embodiment of the present disclosure, the reference voltage Vref0 in the comparator circuit 100 in FIG. 3 is set lower than the Zener voltage Vzd of the Zener diode 64. With the reference voltage Vref0 being set as such, even if there is an influence of the leakage current of the capacitor 50, 51, the power factor correction IC 23 can detect that the inductor current IL reaches zero, as in the case of the Zener diode 63.

The maximum voltage that is the Zener voltage Vzd of the Zener diode 64 corresponds to the "first level", and the minimum voltage that has dropped lower than the ground voltage by an amount corresponding to the forward voltage VF of the Zener diode 63 corresponds to the "second level".

Summary

The AC-DC converter 10 according to an embodiment of the present disclosure has been described above. The current detection circuit 40a includes the capacitors 50 and 51. The current detection circuit 40a outputs the voltage Va corresponding to the voltage Vsw, to thereby indicate that the inductor current IL reaches zero after the NMOS transistor 24 is turned off. This makes it possible to provide the current detection circuit configured to detect that the inductor current reaches zero without using the transformer that includes the secondary winding.

Further, the current detection circuit 40a includes the setting circuit 52. Since the voltage Va is a voltage obtained by dividing the AC component of the voltage Vsw by the capacitors 50 and 51, the DC level thereof may not be determined. Accordingly, the setting circuit 52 is provided to determine the DC level of voltage Va. This makes it possible to set the DC level of the voltage Va, thereby being able to suppress the voltage Va from always being a positive voltage or a negative voltage due to the leakage current and the like of the capacitor 50, 51.

Further, the setting circuit 52 is the resistor 60. The use of resistor 60 for the setting circuit 52 makes it possible to cause the DC level of the voltage Va to be the ground voltage, even whether the NMOS transistor 24 is on or off.

Further, the setting circuit 52 is the clamp circuit 53. With the voltage Va being clamped by the clamp circuit 53, it is possible to set the maximum voltage of the voltage Va to a predetermined level. This makes it possible to limit the voltage Va applied to the terminal A of the power factor correction IC 23.

Further, the clamp circuit 53 includes the diode 62. The forward voltage VF of the diode 62 becomes the maximum voltage of the voltage Va. This makes it possible to limit the voltage Va applied to the terminal A of the power factor correction IC 23 to the forward voltage VF of the diode 62 at the maximum.

Further, the clamp circuit 53 can set the minimum voltage of the voltage Va to a predetermined level. With the provision of the clamp circuit 53, the voltage Va is likely to become a positive voltage, without becoming a large negative voltage.

Further, the clamp circuit 53 includes the diodes 61 and 62. With the diodes 61 and 62 being coupled in anti-parallel, the maximum and minimum voltages of the voltage Va can be set to the predetermined levels. Further, the amount of change in the voltage level of the voltage Va decreases, however, with the reference voltage Vref0 being set appropriately, the current detection circuit 40c can output the voltage Va indicating that the inductor current IL reaches appropriately.

Further, the clamp circuit 54 is the Zener diode 63. With the Zener diode 63 being used as the clamp circuit 54, the maximum voltage of the voltage Va can be caused to be the forward voltage VF of the Zener diode 63, and the minimum voltage of the voltage Va can be caused to be the Zener voltage Vzd of the Zener diode 63. This makes it possible to implement the clamp circuit with the single Zener diode.

Further, the clamp circuit 55 is the Zener diode 64. With the Zener diode 64 being used as the clamp circuit 55, the maximum voltage of the voltage Va can be caused to be the Zener voltage Vzd of the Zener diode 64, and the minimum voltage of the voltage Va can be caused to be the forward voltage VF of the Zener diode 64. This increases the degree of freedom in setting the level of the reference voltage Vref0.

The capacitance value Cs of the capacitor 50 is smaller than the capacitance value Cdet of the capacitor 51. This enables the current detection circuit 40a to cause the voltage Va obtained by dividing the voltage Vsw to a voltage level that is detectable by the power factor correction IC 23.

The rated voltage of the capacitor 50 is higher than the rated voltage of the capacitor 51. This enables the current detection circuit 40a to cause the voltage Va obtained by dividing the voltage Vsw to a voltage level that is detectable by the power factor correction IC 23.

The power factor correction IC 23 includes the terminal A, the comparator circuit 100, and the driver circuit 101. Accordingly, with the reference voltage Vref0 in the comparator circuit 100 being set appropriately, the power factor correction IC 23 can detect that the inductor current IL reaches zero, based on the voltage Va from the current detection circuit 40a.

The present disclosure is directed to provision of a current detection circuit configured to detect that an inductor current reaches zero without using a transformer that includes a secondary winding.

According to the present disclosure, it is possible to provide a current detection circuit configured to detect that an inductor current reaches zero without using a transformer that includes a secondary winding.

Embodiment(s) and modification(s) of the present disclosure described above are simply to facilitate understanding of the present disclosure and are not in any way to be construed as limiting the present disclosure. The present disclosure may variously be changed or altered without departing from its essential features and encompass equivalents thereof.

US 12,695,382 B2

15

16

What is claimed is:

1. A current detection circuit for a power supply circuit configured to generate an output voltage from an input voltage thereof, the power supply circuit including
   an inductor configured to receive the input voltage,
   a transistor configured to control an inductor current flowing through the inductor, and
   a diode coupled to a first node, which is a node at which the inductor and the transistor are coupled,
the current detection circuit being configured to detect the inductor current, the current detection circuit comprising:
   a first capacitor coupled to the first node;
   a second capacitor provided between the first capacitor and a ground, the second capacitor being coupled in series with the first capacitor at a second node; and
   a setting circuit, including a resistor, configured to set a direct-current (DC) level of a voltage at the second node, wherein
   the second capacitor and the resistor form a RC parallel circuit, which has a time constant longer than a switching period of the transistor.

2. A current detection circuit for a power supply circuit configured to generate an output voltage from an input voltage thereof, the power supply circuit including
   an inductor configured to receive the input voltage,
   a transistor configured to control an inductor current flowing through the inductor, and
   a diode coupled to a first node, which is a node at which the inductor and the transistor are coupled,
the current detection circuit being configured to detect the inductor current, the current detection circuit comprising:
   a first capacitor coupled to the first node;
   a second capacitor provided between the first capacitor and a ground, the second capacitor being coupled in series with the first capacitor; and
   a setting circuit configured to set a direct-current (DC) level of a voltage at a second node, which is a node at which the first capacitor and the second capacitor are coupled, wherein
   the setting circuit is a clamp circuit configured to clamp the voltage at the second node to a first level, when the transistor is off.

3. The current detection circuit according to claim 2, wherein the clamp circuit includes a first diode having a cathode that is grounded and an anode coupled to the second node.

4. The current detection circuit according to claim 2, wherein the clamp circuit clamps the voltage at the second node to a second level, when the transistor is on.

5. The current detection circuit according to claim 4, wherein the clamp circuit includes
   a second diode having a cathode that is grounded and an anode coupled to the second node, and
   a third diode having a cathode coupled to the second node and an anode that is grounded.

6. The current detection circuit according to claim 4, wherein the clamp circuit is a Zener diode.

7. The current detection circuit according to claim 6, wherein
   the Zener diode has a cathode coupled to the second node and an anode that is grounded,
   the first level is a level of a Zener voltage of the Zener diode, and
   the second level is a level of a forward voltage of the Zener diode.

8. The current detection circuit according to claim 1, wherein a first capacitance value of the first capacitor is smaller than a second capacitance value of the second capacitor.

9. The current detection circuit according to claim 8, wherein a first rated voltage of the first capacitor is higher than a second rated voltage of the second capacitor.

10. A power supply circuit configured to generate an output voltage from an input voltage thereof, the power supply circuit comprising:
   an inductor configured to receive the input voltage;
   a transistor configured to control an inductor current flowing through the inductor;
   a diode coupled to a first node, which is a node at which the inductor and the transistor are coupled;
   a current detection circuit configured to detect the inductor current; and
   an integrated circuit configured to switch the transistor, based on a detection voltage outputted from the current detection circuit, wherein
   the current detection circuit includes
      a first capacitor coupled to the first node, and
      a second capacitor provided between the first capacitor and a ground, the second capacitor being coupled in series with the first capacitor at a second node,
      a setting circuit, including a resistor, configured to set a direct-current (DC) level of a voltage at the second node, the second capacitor and the resistor forming a RC parallel circuit, which has a time constant longer than a switching period of the transistor, the current detection circuit being configured to output, as the detection voltage, the voltage at the second node; and
   the integrated circuit includes
      a terminal configured to receive the voltage at the second node,
      a comparator circuit configured to compare the received voltage at the terminal with a reference voltage, and
      a driver circuit configured to
         turn on the transistor, based on a result of comparison of the comparator circuit, and
         turn off the transistor, based on another voltage corresponding to the output voltage.

11. A power supply circuit configured to generate an output voltage from an input voltage thereof, the power supply circuit comprising:
   an inductor configured to receive the input voltage;
   a transistor configured to control an inductor current flowing through the inductor;
   a diode coupled to a first node, which is a node at which the inductor and the transistor are coupled;
   a current detection circuit configured to detect the inductor current; and
   an integrated circuit configured to switch the transistor, based on a detection voltage outputted from the current detection circuit, wherein
   the current detection circuit includes
      a first capacitor coupled to the first node, and
      a second capacitor provided between the first capacitor and a ground, the second capacitor being coupled in series with the first capacitor,
      a setting circuit configured to set a direct-current (DC) level of a voltage at a second node, which is a node at which the first capacitor and the second capacitor are coupled, the setting circuit being a clamp circuit configured to clamp the voltage at the second node to a first level, when the transistor is off, the current detection circuit being configured to output, as the detection voltage, the voltage at the second node; and the integrated circuit includes a terminal configured to receive the voltage at the second node, a comparator circuit configured to compare the received voltage at the terminal with a reference voltage, and a driver circuit configured to turn on the transistor, based on a result of comparison of the comparator circuit, and turn off the transistor, based on another voltage corresponding to the output voltage.

* * * * *